United States Patent
Getty et al.

(10) Patent No.: US 11,508,684 B2
(45) Date of Patent: Nov. 22, 2022

(54) STRUCTURE FOR BONDING AND ELECTRICAL CONTACT FOR DIRECT BOND HYBRIDIZATION

(71) Applicant: RAYTHEON COMPANY, Waltham, MA (US)

(72) Inventors: Jonathan Getty, Goleta, CA (US); Daniel D. Lofgreen, Goleta, CA (US); Alexandra V. Miller, Orcutt, CA (US)

(73) Assignee: RAYTHEON COMPANY, Waltham, MA (US)

(*) Notice: Subject to any disclaimer, the term of this patent is extended or adjusted under 35 U.S.C. 154(b) by 329 days.

(21) Appl. No.: 16/737,570

(22) Filed: Jan. 8, 2020

(65) Prior Publication Data
US 2021/0210455 A1    Jul. 8, 2021

(51) Int. Cl.
*H01L 23/00* (2006.01)

(52) U.S. Cl.
CPC .............. *H01L 24/27* (2013.01); *H01L 24/30* (2013.01); *H01L 2224/83209* (2013.01); *H01L 2224/83409* (2013.01); *H01L 2224/83896* (2013.01); *H01L 2924/14* (2013.01)

(58) Field of Classification Search
CPC . H01L 2224/08147; H01L 2224/83898; H01L 2224/83903; H01L 2224/83209; H01L 2224/83409; H01L 2224/08145; H01L 24/27
See application file for complete search history.

(56) References Cited

U.S. PATENT DOCUMENTS

| | | | |
|---|---|---|---|
| 8,395,191 B2 | 3/2013 | Or-Bach et al. | |
| 9,129,963 B1 | 9/2015 | Yang | |
| 9,287,225 B2* | 3/2016 | Nakamura | H01L 24/13 |
| 2002/0195599 A1* | 12/2002 | Yu | H01L 21/02488 |
| | | | 257/E21.12 |
| 2019/0017286 A1 | 1/2019 | Hossain | |

FOREIGN PATENT DOCUMENTS

| EP | 3061125 A1 | 8/2016 |
|---|---|---|
| KR | 101252292 B1 | 4/2013 |
| WO | 2019213601 A1 | 11/2019 |

OTHER PUBLICATIONS

ISR/WO Application No. PCT/US2020/059326; dated Feb. 23, 2021; pp. 16.

* cited by examiner

*Primary Examiner* — Tucker J Wright
(74) *Attorney, Agent, or Firm* — Cantor Colburn LLP

(57) ABSTRACT

A direct bond hybridization (DBH) method is provided. The DBH method includes preparing a first underlying layer, a first contact layer disposed on the first underlying layer and a first contact electrically communicative with the first underlying layer and protruding through the first contact layer, preparing a second underlying layer, a second contact electrically communicative with the second underlying layer and formed of softer material than the first contact and a second contact layer disposed on the second underlying layer and defining an aperture about the second contact and a moat at least partially surrounding the second contact and bonding the first and second contact layers whereby the first contact contacts the second contact such that the second contact deforms and expands into the moat.

19 Claims, 4 Drawing Sheets

STRUCTURE FOR BONDING AND ELECTRICAL CONTACT FOR DIRECT BOND HYBRIDIZATION

BACKGROUND

The present disclosure relates to bonding and electrical contact and, in particular, to a structure for bonding and for forming electrical contacts for direct bond hybridization of infrared (IR) detectors.

Direct bonding is a wafer bonding process that does not involve the use of intermediate layers. The bonding process is based on the formation of chemical bonds between two surfaces of suitable materials. Typically, direct bonding includes wafer preprocessing operations, pre-bonding operations and annealing operations.

Currently direct bond hybridization methods often requires oxide deposition and polishing operations to create a nearly planar surface with slightly recessed contacts for successful bonding. Much of the equipment used for this process would be contaminated if used to prepare compound semiconductor detectors in the same way.

SUMMARY

According to an aspect of the disclosure, a direct bond hybridization (DBH) method is provided. The DBH method includes preparing a first underlying layer, a first contact layer disposed on the first underlying layer and a first contact electrically communicative with the first underlying layer and protruding through the first contact layer, preparing a second underlying layer, a second contact electrically communicative with the second underlying layer and formed of softer material than the first contact and a second contact layer disposed on the second underlying layer and defining an aperture about the second contact and a moat at least partially surrounding the second contact and bonding the first and second contact layers whereby the first contact contacts the second contact such that the second contact deforms and expands into the moat.

In accordance with additional or alternative embodiments, the first and second contact layers include thermal oxide.

In accordance with additional or alternative embodiments, the bonding includes isostatic pressing (IP).

In accordance with additional or alternative embodiments, no portion of the second contact intervenes between the first and second contact layers during the bonding.

In accordance with additional or alternative embodiments, the second underlying layer includes a device layer.

In accordance with additional or alternative embodiments, the device layer includes a read-out integrated circuit (ROIC).

In accordance with additional or alternative embodiments, the first contact is plural in number and the aperture and the second contact are both plural in number in correspondence with a number of the plural first contacts.

In accordance with additional or alternative embodiments, the second contact includes Indium (In).

In accordance with additional or alternative embodiments, the first contact is non-compressible as compared with the second contact.

According to an aspect of the disclosure, a direct bond hybridization (DBH) method is provided. The DBH method includes preparing a first underlying layer, a first contact layer disposed on the first underlying layer and a first contact electrically communicative with the first underlying layer and extending through the first contact layer to be coplanar with the first contact layer, preparing a second underlying layer, a second contact electrically communicative with the second underlying layer and formed of softer material than the first contact and a second contact layer, which is disposed on the second underlying layer, through which the second contact protrudes and which defines an aperture about the second contact and a moat at least partially surrounding the second contact and bonding the first and second contact layers whereby the second contact contacts the first contact such that the second contact deforms and expands into the moat.

In accordance with additional or alternative embodiments, the first and second contact layers include thermal oxide.

In accordance with additional or alternative embodiments, the bonding includes isostatic pressing (IP).

In accordance with additional or alternative embodiments, no portion of the second contact intervenes between the first and second contact layers during the bonding.

In accordance with additional or alternative embodiments, the first underlying layer includes a device layer.

In accordance with additional or alternative embodiments, the device layer includes a read-out integrated circuit (ROIC).

In accordance with additional or alternative embodiments, the first contact is plural in number and the aperture and the second contact are both plural in number in correspondence with a number of the plural first contacts.

In accordance with additional or alternative embodiments, the second contact includes Indium (In).

In accordance with additional or alternative embodiments, the first contact is non-compressible as compared with the second contact.

According to an aspect of the disclosure, a hybridized device assembly is provided and includes a first underlying layer including a first surface, a second underlying layer including a second surface opposite the first surface, first oxide material and first contacts disposed on the first surface in an interleaved arrangement and second oxide material, which is bonded with the first oxide material, and second contacts disposed on the second surface, the second oxide material being interleaved with the second contacts and moats at least partially surrounding the second contacts.

In accordance with additional or alternative embodiments, the second underlying layer includes a device layer or the first underlying layer comprises a device layers.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a direct bond hybridization (DBH) method is proposed. The DBH method does not require planarization and can be executed at various types of foundries and factories. The DBH method involves the use of first and second contacts, which can be self-aligned, where one of the first and second contacts is more ductile than the other and sits in an oversized via or aperture. When bonding occurs, the ductile contact can be compressed to the correct height and still expand within the oversized via or aperture.

Figure 1:
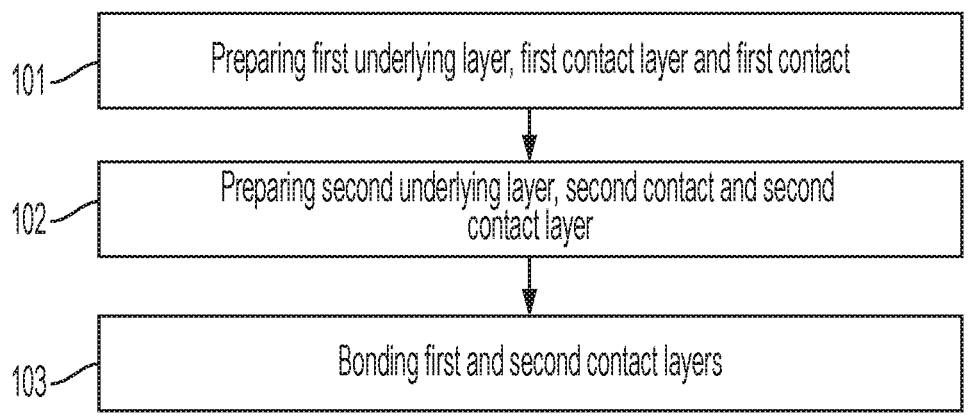
FIG. 1 is a flow diagram illustrating a direct bond hybridization method in accordance with embodiments.

With reference to FIG. 1, a DBH method is provided. As shown in FIG. 1, the DBH method includes preparing a first underlying layer, a first contact layer disposed on the first underlying layer and a first contact electrically communicative with the first underlying layer and protruding through the first contact layer (block 101), preparing a second underlying layer, a second contact electrically communicative with the second underlying layer and formed of softer material than the first contact and a second contact layer disposed on the second underlying layer and defining an aperture about the second contact and a moat at least partially surrounding the second contact (block 102) and bonding the first and second contact layers whereby the first contact contacts the second contact such that the second contact deforms and expands into or occupies the moat (block 103).

Figure 2:
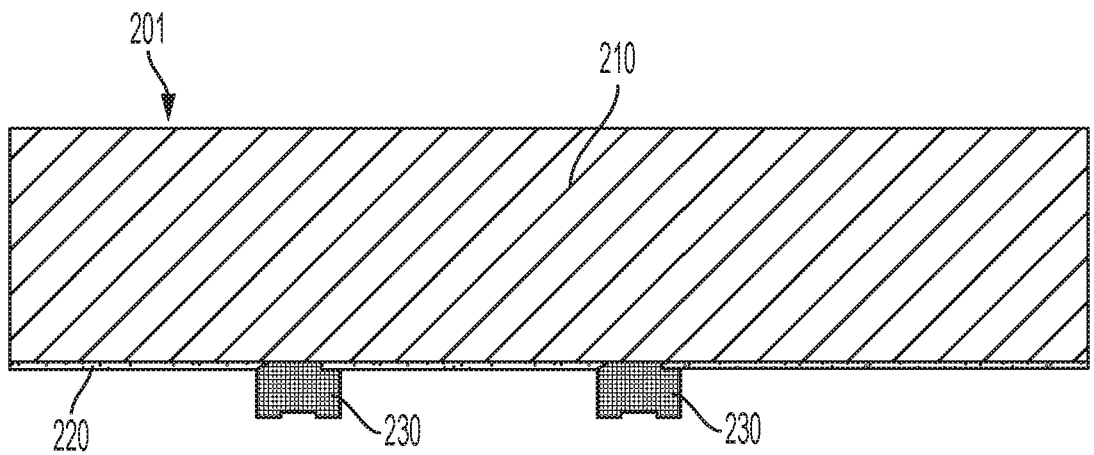
FIG. 2 is a side view of initial stages of the direct bond hybridization method of FIG. 1 in accordance with embodiments.
Figure 2:
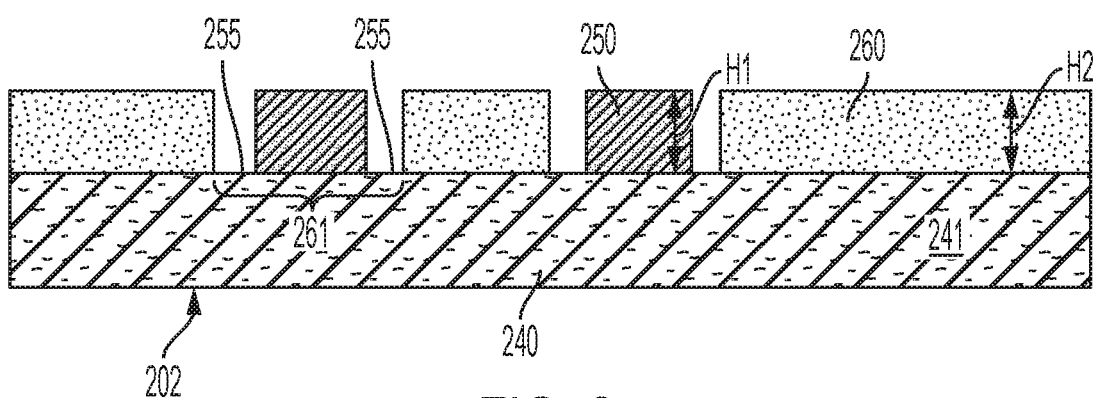
Figure 3:
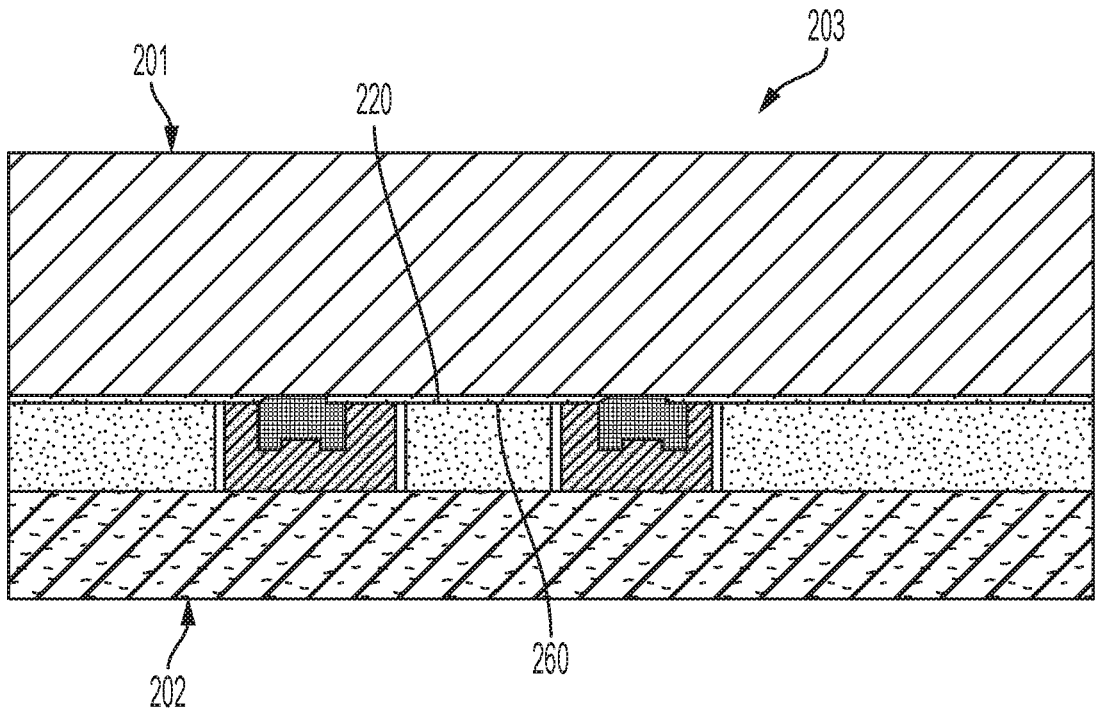
FIG. 3 is a side view of late stages of the direct bond hybridization method of FIG. 1 in accordance with embodiments.

With reference to FIGS. 2 and 3, exemplary details of the DBH method of FIG. 1 will now be described.

As shown in FIG. 2, first and second assembly elements 201 and 202 are provided. The first assembly element 201 includes a first underlying layer 210, a first contact layer 220 that is disposed on the first underlying layer 210 and a first contact 230. The first contact 230 is electrically communicative with the first underlying layer 210 and protrudes through the first contact layer 220. The second assembly element 202 includes a second underlying layer 240, a second contact 250 that is electrically communicative with the second underlying layer 240 and formed of softer or more compressible material than the first contact 230 and a second contact layer 260. The second contact layer 260 is disposed on the second underlying layer 240 and is formed to define an aperture 261 about the second contact 250 and a moat 255 that at least partially surrounds the second contact 250.

The first underlying layer 210 can include a semiconductor layer, such as an Indium-Gallium-Arsenic (InGaAs) absorber layer, and a cap layer, such as an Indium-Phosphorous (InP) layer, which is interposed between the semiconductor layer and the first contact layer 220. The first underlying layer 210 can also include additional layers beneath the semiconductor layer. The second underlying layer 240 can include or be provided as a read-out integrated circuit (ROIC) 241 with a pitch that corresponds to the arrangement of the first contact 230. The first and second contact layers 220 and 260 can each be formed of thermal oxide that is suitable for oxide bonding.

In accordance with embodiments, the height H1 can be within a predefined fraction (e.g., ~0.2 μm but other or further fractional ranges are possible) of the height H2. The height control can be accomplished through chemical mechanical polishing (CMP) or another suitable processing technique that offers thickness control.

The first contact 230 can be provided as plural first contacts 230, such as active diodes, disposed in electric communication with the first underlying layer 210. Where the first contact 230 is provided as plural first contacts 230, the second contact 250, the moat 255 and the aperture 261 can also be provided as pluralities thereof (i.e., plural second contacts 250, plural moats 255 at least partially surrounding each second contact 250 and plural apertures 261 about each of the second contacts 250 and the corresponding moats 255). Respective numbers of the plural second contacts 250, the plural moats 255 and the plural apertures 261 correspond to the number of the plural first contacts 230.

In accordance with embodiments, the second contact(s) 250 can be formed of Indium (In) or another relatively soft conductive material and the first contact(s) 230 can be formed of a metal, such as Nickel (Ni), which is substantially non-compressible relative to the first contact(s) 230.

Each moat 255 is defined to at least partially surround the corresponding second contact 250 within the corresponding aperture 261. A size or width of the moat 255 is sufficient to accommodate the deformation of the second contact 250 during the bonding (see block 103 of FIG. 1).

As shown in FIG. 3, the first assembly element 201 and the second assembly element 202 are arranged with the first and second contact layers 220 and 260 in contact and with the first contact(s) 230 contacting and impinging onto the second contact(s) 250. Once such contacts are established, the first and second contact layers 220 and 260 are bonded by hot or cold isostatic pressing (IP), for example, or another suitable process, whereby the first contact(s) 230 contact and impinge onto the second contact(s) 250 such that the second contact(s) 250 deform and expand into or occupy at least a portion of the corresponding moat(s) 255.

In accordance with embodiments, an actual process flow can include alignment and initial bonding on a flip-chip bonding tool, IP with or without heating and annealing that might or might not be needed if the IP involves sufficient heating.

Where the height H1 of each second contact 250 is slightly greater than the height H2 of the second contact layer 260 and each aperture 261 is wider than the corresponding second contact 250, the deformation of the second contact 250 resulting from contact and impingement by the corresponding first contact 220 is a compressive deformation in the height-wise dimension and an outward flow deformation in the width-wise dimension.

In accordance with further embodiments, the height H1 of the second contact 250 can be shortened by etching, for example, and the height of the corresponding first contact 220 can be made taller to compensate. In some cases, such as where relatively thick contact metallurgies are warranted, this additional processing can be desirable.

It is to be understood that the width of each aperture 261 can exceed a final width of the corresponding second contact 250 following the deformation. This contributes to insuring that no part of any second contact 250 flows toward and into an intervening position between the first and second contact layers 220 and 260 prior to or during the bonding.

Following the bonding, the first assembly element 201 and the second assembly element 202 cooperatively form a DBH assembly 203 that can be used as a focal plane, for example.

Figure 4:
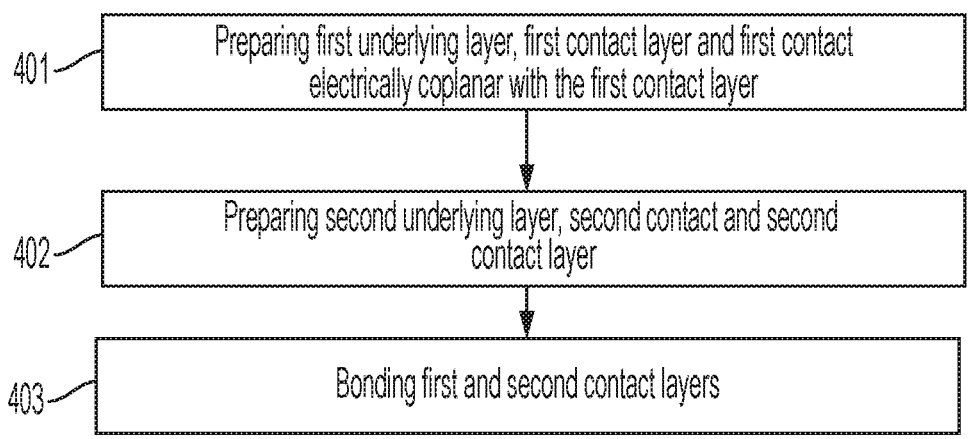
FIG. 4 is a flow diagram illustrating a direct bond hybridization method in accordance with alternative embodiments.

With reference to FIG. 4, a DBH method is provided and has the opposite overall configuration as what is shown and discussed in FIGS. 1-3 and the accompanying text above. As shown in FIG. 4, the DBH method includes preparing a first underlying layer, a first contact layer disposed on the first underlying layer and a first contact electrically communicative with the first underlying layer and extending through the first contact layer to be coplanar with the first contact layer (block 401), preparing a second underlying layer, a second contact electrically communicative with the second underlying layer and formed of softer material than the first contact and a second contact layer, which is disposed on the second underlying layer, through which the second contact protrudes and which defines an aperture about the second contact and a moat at least partially surrounding the second contact (block 402) and bonding the first and second contact layers whereby the second contact contacts the first contact such that the second contact deforms and expands into or occupies the moat (block 403).

Figure 5:
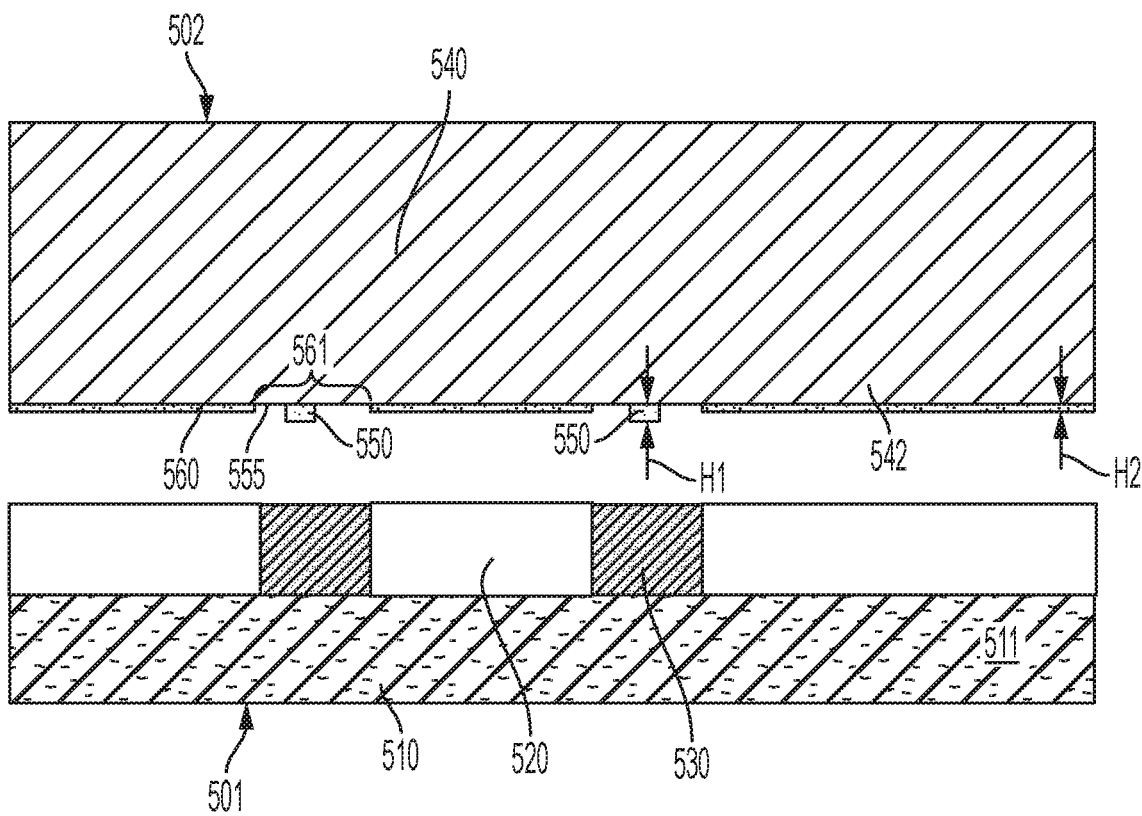
FIG. 5 is a side view of initial stages of the direct bond hybridization method of FIG. 4 in accordance with alternative embodiments.
Figure 6:
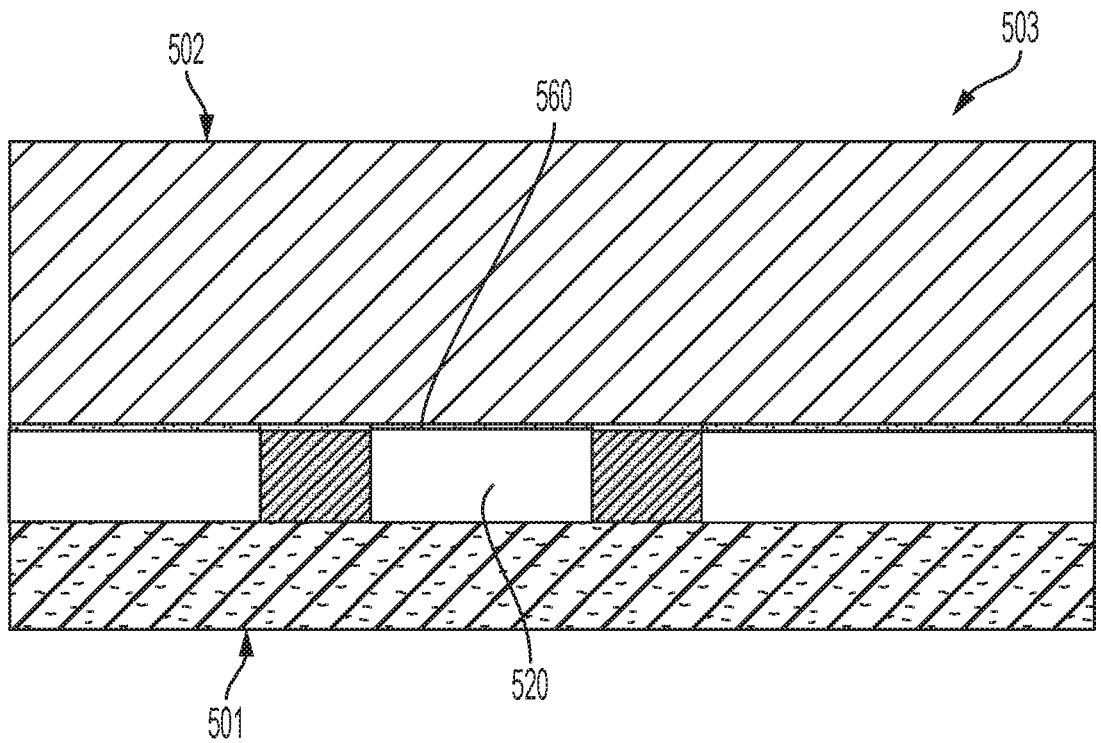
FIG. 6 is a side view of late stages of the direct bond hybridization method of FIG. 4 in accordance with alternative embodiments.

With reference to FIGS. 5 and 6, exemplary details of the DBH method of FIG. 4 (which, again, is opposite the overall configuration of FIGS. 2 and 3) will now be described.

As shown in FIG. 5, first and second assembly elements 501 and 502 are provided. The first assembly element 501 includes a first underlying layer 510, a first contact layer 520 that is disposed on the first underlying layer 510 and a first contact 530. The first contact 530 is electrically communicative with the first underlying layer 510 and extends through the first contact layer 520 to be optionally coplanar with the first contact layer 520. The second assembly element 502 includes a second underlying layer 540, a second contact 550 that is electrically communicative with the second underlying layer 540 and formed of softer or more compressible material than the first contact 530 and a second contact layer 560. The second contact layer 560 is disposed on the second underlying layer 540. The second contact 550 protrudes through the second contact layer 560 from the second underlying layer 540. The second contact layer 560 is formed to define an aperture 561 about the second contact 550 and a moat 555 that at least partially surrounds the second contact 550.

The first underlying layer 510 can include or be provided as a read-out integrated circuit (ROIC) 511 with a pitch that corresponds to the arrangement of the second contact 550. The second underlying layer 540 can include a semiconductor layer, such as an Indium-Gallium-Arsenic (InGaAs) absorber layer, and a cap layer, such as an Indium-Phosphorous (InP) layer, which is interposed between the semiconductor layer and the second contact layer 560. The second underlying layer 540 can also include additional layers beneath the semiconductor layer. The first and second contact layers 520 and 560 can each be formed of thermal oxide that is suitable for oxide bonding.

A height H1 of the second contact 550 from a surface of the second underlying layer 540 can be slightly greater than a height H2 of the second contact layer 560 from the surface of the second underlying layer 540. In accordance with embodiments, the height H1 can be within a predefined fraction (e.g., ~0.2 μm but other or further fractional ranges are possible) of the height H2. The height control can be accomplished through chemical mechanical polishing (CMP) or another suitable processing technique that offers thickness control. Respective heights of the first contact 530 and the first contact layer 520 from the first underlying layer 510 can be substantially similar or equal.

The first contact 530 can be provided as plural first contacts 530 disposed in electric communication with the ROIC 511 of the first underlying layer 510. Where the first contact 530 is provided as plural first contacts 530, the second contact 550, the moat 555 and the aperture 561 can also be provided as pluralities thereof (i.e., plural second contacts 550, plural moats 555 at least partially surrounding each second contact 550 and plural apertures 561 about each of the second contacts 550 and the corresponding moats 555). Respective numbers of the plural second contacts 550, the plural moats 555 and the plural apertures 561 correspond to the number of the plural first contacts 530.

In accordance with embodiments, the second contact(s) 550 can be formed of Indium (In) or another relatively soft conductive material and the first contact(s) 530 can be formed of a metal, such as Nickel (Ni), which is substantially non-compressible relative to the first contact(s) 530.

Each moat 555 is defined to at least partially surround the corresponding second contact 550 within the corresponding aperture 561. A size or width of the moat 555 is sufficient to accommodate the deformation of the second contact 550 during the bonding (see block 403 of FIG. 4).

As shown in FIG. 6, the first assembly element 501 and the second assembly element 502 are arranged with the first and second contact layers 520 and 560 in contact and with the first contact(s) 530 contacting and impinging onto the second contact(s) 550. Once such contacts are established, the first and second contact layers 520 and 560 are bonded by hot or cold isostatic pressing (IP), for example, or another suitable process, whereby the first contact(s) 530 contact and impinge onto the second contact(s) 550 such that the second contact(s) 550 deform and expand into or occupy at least a portion of the corresponding moat(s) 555.

As above and, in accordance with embodiments, an actual process flow can include alignment and initial bonding on a flip-chip bonding tool, IP with or without heating and annealing that might or might not be needed if the IP involves sufficient heating.

Where the height H1 of each second contact 550 is slightly greater than the height H2 of the second contact layer 560 and each aperture 561 is wider than the corresponding second contact 550, the deformation of the second contact 550 resulting from contact and impingement by the corresponding first contact 520 is a compressive deformation in the height-wise dimension and an outward flow deformation in the width-wise dimension.

In accordance with further embodiments, the first contacts 530 need not be coplanar with the first contact layer 520. For example, the first contacts 530 can be etched so as to be recessed by the first contact layer 520 and the height H1 of the second contacts 550 can be increased to compensate. In some cases, such as where relatively thick contact metallurgies are warranted, this additional processing can be desirable.

It is to be understood that the width of each aperture 561 can exceed a final width of the corresponding second contact 550 following the deformation. This contributes to insuring that no part of any second contact 550 flows toward and into an intervening position between the first and second contact layers 520 and 560 prior to or during the bonding.

Following the bonding, the first assembly element 501 and the second assembly element 502 cooperatively form a DBH assembly 503 that can be used as a focal plane, for example.

Figure 7:
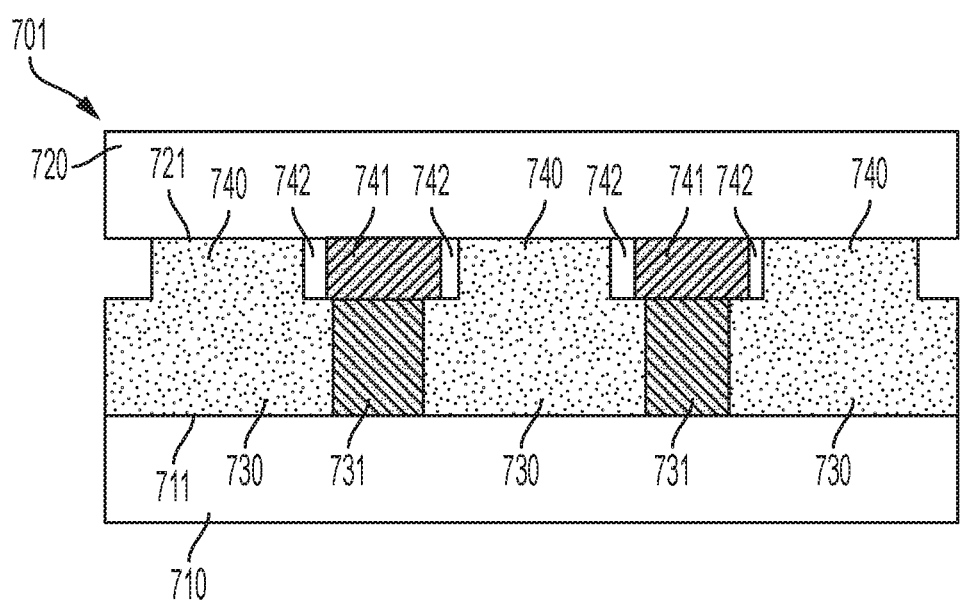
FIG. 7 is a side schematic illustration of a hybridized device assembly in accordance with embodiments.

With reference to FIG. 7, a hybridized device assembly 701 is provided prior to or following annealing (if annealing is used). As shown in FIG. 7, the hybridized device assembly 701 includes a first underlying layer 710 including a first surface 711, a second underlying layer 720 including a second surface 721 opposite the first surface 711 and first oxide material 730 and first contacts 731 disposed on the first surface 711 in an interleaved arrangement. The hybridized device assembly 701 further includes second oxide material 740, which is bonded with the first oxide material 730, and second contacts 741. The second oxide material 740 and the second contacts 741 are disposed on the second surface 721 and the second oxide material 740 is interleaved with the second contacts 741 and moats 742 at least partially surrounding the second contacts 741. In accordance with embodiments, the first and second underlying layers 710 and 720 can include semiconductor and device layers, respectively, or device and semiconductor layers, respectively. In addition, the first contacts 731 and the second contacts 741 can be made of different materials having different compressibility.

Although the embodiments and examples provided above refer to DBH processing and processes that include oxide bonding, it is to be understood that oxide bonding in particular is not required especially if the metallic bonding between corresponding contacts proved to be sufficient (i.e., in a structural sense). In these or other cases, the wafers bottom out on each other without forming an oxide bond and possibly without an annealing operation.

Technical effects and benefits of the present invention are the provision of a DBH method that does not require planarization and can be executed at various types of foundries and factories.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A direct bond hybridization (DBH) method, comprising:
    preparing a first underlying layer, a first contact layer disposed on the first underlying layer and a first contact electrically communicative with the first underlying layer and protruding through the first contact layer;
    preparing a second underlying layer, a second contact electrically communicative with the second underlying layer and formed of softer material than the first contact and a second contact layer disposed on the second underlying layer and defining an aperture about the second contact and a moat at least partially surrounding the second contact; and
    bonding the first and second contact layers whereby the first contact contacts the second contact such that the second contact deforms and expands into the moat.

2. The DBH method according to claim 1, wherein the first and second contact layers comprise thermal oxide.

3. The DBH method according to claim 1, wherein the bonding comprises isostatic pressing (IP).

4. The DBH method according to claim 1, wherein no portion of the second contact intervenes between the first and second contact layers during the bonding.

5. The DBH method according to claim 1, wherein the second underlying layer comprises a device layer.

6. The DBH method according to claim 5, wherein the device layer comprises a read-out integrated circuit (ROIC).

7. The DBH method according to claim 5, wherein:
    the first contact is plural in number, and
    the aperture and the second contact are both plural in number in correspondence with a number of the plural first contacts.

8. The DBH method according to claim 5, wherein the second contact comprises Indium (In).

9. The DBH method according to claim 8, wherein the first contact is non-compressible as compared with the second contact.

10. A direct bond hybridization (DBH) method, comprising:
    preparing a first underlying layer, a planar first contact layer disposed on a planar surface of the first underlying layer and a first contact electrically communicative with the first underlying layer and protruding through the planar first contact layer;
    preparing a second underlying layer, a second contact electrically communicative with the second underlying layer and formed of softer material than the first contact and a planar second contact layer disposed on a planar surface of the second underlying layer and defining an aperture about the second contact and a moat at least partially surrounding the second contact in a plane of the planar second contact layer, the moat being characterized in that interior facing surfaces of the planar second contact layer are separated from sides of the second contact in the plane of the planar second contact layer; and
    bonding the first and second contact layers whereby the first contact contacts the second contact such that the second contact deforms and expands into the moat in the plane of the second planar layer.

11. The DBH method according to claim 10, wherein the first and second contact layers comprise thermal oxide.

12. The DBH method according to claim 10, wherein the bonding comprises isostatic pressing (IP).

13. The DBH method according to claim 10, wherein no portion of the second contact intervenes between the first and second contact layers during the bonding.

14. The DBH method according to claim 10, wherein the second underlying layer comprises a device layer.

15. The DBH method according to claim 14, wherein the device layer comprises a read-out integrated circuit (ROIC).

16. The DBH method according to claim 14, wherein:
    the first contact is plural in number, and the aperture and the second contact are both plural in number in correspondence with a number of the plural first contacts.

17. The DBH method according to claim 14, wherein the second contact comprises Indium (In).

18. The DBH method according to claim 17, wherein the first contact is non-compressible as compared with the second contact.

19. A direct bond hybridization (DBH) method, comprising:
  preparing a first underlying layer, a planar first contact layer disposed on a planar surface of the first underlying layer and a first contact electrically communicative with the first underlying layer and protruding through the planar first contact layer;
  preparing a second underlying layer, a second contact electrically communicative with the second underlying layer and formed of softer material than the first contact and a planar second contact layer disposed on a planar surface of the second underlying layer and defining an aperture and a moat about and surrounding the second contact in a plane of the planar second contact layer at which interior facing surfaces of the planar second contact layer are separated from sides of the second contact in the plane of the planar second contact layer; and
  bonding the first and second contact layers whereby the first contact contacts the second contact such that the second contact deforms and expands into the moat in the plane of the second planar layer.

* * * * *